United States Patent [19]
Lacey

[11] Patent Number: 5,469,384
[45] Date of Patent: Nov. 21, 1995

[54] DECODING SCHEME FOR RELIABLE MULTI BIT HOT ELECTRON PROGRAMMING

[75] Inventor: Timothy M. Lacey, Cupertino, Calif.

[73] Assignee: Cypress Semiconductor Corp., San Jose, Calif.

[21] Appl. No.: 312,815

[22] Filed: Sep. 27, 1994

[51] Int. Cl.$^6$ .......................... G11C 11/34; G11C 16/04
[52] U.S. Cl. ................ 365/185.13; 365/230.06; 365/205; 365/184; 365/182
[58] Field of Search ........................ 365/182, 185, 365/184, 205, 230.06, 230.01

[56] References Cited

U.S. PATENT DOCUMENTS

| | | | |
|---|---|---|---|
| 5,262,984 | 11/1993 | Noguchi et al. | 365/185 |
| 5,293,560 | 3/1994 | Harari | 365/185 |
| 5,398,203 | 3/1995 | Prickett, Jr. | 365/185 |

OTHER PUBLICATIONS

Adel S. Sedra et al., "Microelectronic Circuits", CBS College Publishing, 1982, pp. 776–780.

*Primary Examiner*—Viet Q. Nguyen
*Attorney, Agent, or Firm*—Blakely, Sokoloff, Taylor & Zafman

[57] ABSTRACT

A nonvolatile memory circuit having a decoding scheme for reliable multiple bit hot electron programming. The nonvolatile memory circuit has a memory array in which data received at each data input can be programmed into multiple memory bits simultaneously. The address of each memory bit selected for programming is decoded by a row decoder and a column decoder. The row decoder decodes the word line of each selected memory bit and the column decoder decodes the bit line of each selected memory bit. The column decoder includes a programming column decoder and a read column decoder. The programming column decoder is enabled during a programming operation and disabled during a reading operation. The read column decoder is enabled during a reading operation and disabled during a programming operation. During a programming operation, a programming voltage is applied to the nonvolatile memory. The programming voltage generates a current which is distributed among multiple load lines and is eventually applied to each selected memory bit, thereby programming multiple memory bits simultaneously. During a reading operation, the programmed data in a memory bit selected for reading is read by a sense amplifier, which is coupled to the read column decoder. By providing a programming column decoder which is enabled during a programming operation and a read column decoder which is enabled during a reading operation, reliable multiple load lines are generated, thus ensuring the proper programming of the memory bits. Furthermore, the performance of the nonvolatile memory is increased.

15 Claims, 8 Drawing Sheets

DECODING SCHEME FOR RELIABLE MULTI BIT HOT ELECTRON PROGRAMMING

FIELD OF THE INVENTION

The present invention pertains to the field of memories, particularly in integrated circuit form. More specifically, this invention relates to circuitry and a method for programming multiple memory cells simultaneously.

BACKGROUND OF THE INVENTION

One type of prior nonvolatile integrated circuit memory is the erasable programmable read-only memory ("EPROM"). EPROMs frequently use memory cells that have electrically isolated gates (floating gates) such as an enhancement-type n-channel metal-oxide semiconductor field effect transistor (MOSFET) with two gates made of polysilicon material, otherwise known as a FAMOS device. One of the gates in this enhancement-type n-channel MOSFET is not electrically connected to any other part of the circuit (e.g. a floating gate) and the other gate in this enhancement-type n-channel MOSFET functions in the same manner as the gate of a regular enhancement MOSFET (Adel S. Sedra and Kenneth C. Smith, "Microelectronic Circuits", CBS College Publishing, 1982, pp. 776–780.) The EPROM stores information in the memory cells in the form of charge on the floating gates and is programmed by placing a charge on the floating gates. The EPROM can be programmed by a user, and once programmed, the EPROM retains its data until erased. Other memory devices such as a Flash Electrically Erasable Programmable Read Only Memory ("EEPROM") are also user programmable. Flash EEPROMs are also programmed by electrically injecting a charge onto the floating gates.

The EPROM comprises memory cells logically organized by rows and columns which form a memory array. Typically, the rows represent word lines and the columns represent bit lines. By selecting the appropriate word line and bit line, each individual cell may be programmed or read. According to FIG. 1, FAMOS devices 14, 15, 16 and 17 form memory array 11 with FAMOS devices 14 and 15 forming a first row coupled by word line 18a and FAMOS devices 16 and 17 forming a second row coupled by word line 18b and furthermore, FAMOS devices 14 and 16 form a first column coupled by bit line 19a and FAMOS devices 15 and 17 form a second column coupled by bit line 19b.

During a programming operation, once a given memory cell or cells are selected for programming by the Row Decoder and the Column Decoder, a programming voltage, which is channeled through a Load Line Circuit, is applied to the bit line of each selected memory cell. The programming voltage generates a programming current that flows through the selected bit line to increase the drain voltage of the selected memory cell (e.g. FAMOS device), thereby accelerating electrons through the channel of the selected memory cell. Simultaneously, a large positive voltage (greater than the drain voltage) is applied to the control gate of the selected memory cell, thereby establishing an electric field in the insulating oxide of the selected memory cell. This electric field attracts the hot electrons and accelerates them toward the floating gate. In this way the floating gate is charged, and the charge that accumulates on it becomes trapped, thus programming the selected memory cell or cells.

During a reading operation, a voltage is applied to the word line of the selected row. The memory cells that are not programmed will conduct heavily, thus lowering the voltage of its bit line. On the other hand, a programmed cell will not conduct and its bit line remains at a high voltage ( if the bit lines are precharged to high voltages). The column decoder selects one of the bit lines and connects it to the sense amplifier which, in turn, detects the change in voltage of the bit line and thus determines whether the stored bit is a 1 or a 0. Typically, a programmed memory cell stores a "1" and an unprogrammed memory cell stores a "0".

Due to physical and functional limitations of the memory, during programming of the EPROM, the programming current in each bit line must be controlled within certain operating parameters. These physical and functional limitations define a load line "box" within which the current through the memory cell and the voltage across the source/drain current path of the memory cell (current-voltage characteristic curve) must remain in order to ensure the proper programming of the memory cells. In other words, the load line "box" is the voltage/current region where a memory cell can be programmed. The "load line "box" is defined by four points: the minimum source-to-drain voltage/current for fast cells to program, the minimum source-to-drain voltage/current for slow cells to program, the maximum source-to-drain voltage/current to prevent fast cells from snapping back, and the maximum drain-to-source voltage/current that would not cause charge loss. Therefore, in order to ensure proper programming of all the memory cells in the programmable memory array without latchup or charge loss, the Load Line Circuit must provide a load line (or resistance) which operates within the load line "box".

Typical EPROMS have 8 outputs which provide 8 programming paths to allow the user to program 8 bits at a time. Unfortunately, programming only 8 bits at a time takes considerable time to program an entire programmable memory array which typically ranges in size from 16K–1M bits. Furthermore, since the programming of the EPROM device consumes the largest portion of the programmable memory test time during manufacturing, it would be advantageous to program multiple bits on each programming path. Reducing the production test time of these EPROM devices will increase the production through-put thereby reducing the manufacturing costs associated with these EPROM devices.

In an attempt to resolve this issue, the prior art provided a test mode that would allow a tester to program 4 bits per output at a time by selecting four column addresses per output, rather than one. However, by having multiple memory cells share the same load line, the effective load line "box" becomes much smaller and much harder to predict. Unfortunately, when the load line "box" is reduced in size, it becomes difficult to ensure that the fast bits will program, and that substantial substrate current will not cause latchup. Because four times as much current needs to be supplied to the memory array, the resistance of the Load Line Circuit is decreased. The decrease in the resistance of the Load Line Circuit negatively impacts the performance of the programmable memory device by increasing the load seen by the sense amplifier. Furthermore, the sense amplifier requires an extra device to block the high voltage from damaging the sense amplifier. Therefore, it is advantageous to provide an EPROM device that can program multiple bits simultaneously in a reliable manner that enhances the performance of the EPROM device.

SUMMARY AND OBJECTS OF THE INVENTION

In view of the limitations of the known circuitry and methods, one of the objectives of the present invention is to provide reliable circuitry and a method for simultaneously programming multiple memory cells in a nonvolatile memory by implementing an improved column decoding scheme to select the memory cells to be programmed.

Therefore, it is desirable to provide a column decoding scheme for a nonvolatile memory which generates reliable multiple bit load lines operating within the load line "box", thus ensuring the proper programming of the memory cells.

It is also desirable to provide a column decoding scheme, having a separate programming column decoder and a separate read column decoder, that increases the performance of the circuitry by decreasing the load seen by the sense amplifier and increasing the performance of the read column decoder.

It is also desirable to provide a nonvolatile memory that reduces programming time during production testing in order to reduce the manufacturing cost of the programmable memory device.

It is further desirable to provide a nonvolatile memory that allows a user to program multiple bits with unique data simultaneously; thereby, not only reducing the manufacturing test time but also reducing the programming time for the end-user (e.g. customer).

The nonvolatile memory circuit in the present invention comprises of a memory array that includes memory cells, bit lines and word lines such that each memory cell is coupled to a bit line and a word line. The location of the memory cells selected for programming or reading are determined by the row decoder which selects the appropriate word lines, and the column decoder which selects the appropriate bit lines. The column decoder has a separate read column decoder and a separate programming column decoder.

During a programming operation, the programming column decoder selects the appropriate bit lines and the row decoder selects the appropriate word lines. Furthermore, the programming column decoder is coupled to a load line circuit such that during a programming operation, the load line circuit provides a resistance in the path from the programming input to the memory cells selected for programming. This resistance ensures the proper programming of the selected memory cells.

During a reading operation, the read column decoder selects the appropriate bits lines and the row decoder selects the appropriate word lines. Furthermore, the read column decoder is coupled to a sense amplifier which reads the data stored in the memory cells selected for a reading operation.

Other features and advantages of the present invention will be apparent form the accompanying drawings and from the detailed description that follows.

BRIEF DESCRIPTION OF THE DRAWINGS

The present invention is illustrated by way of example and is not limited to the figures of the accompanying drawings, in which like references indicate similar elements and in which.

DETAILED DESCRIPTION

One type of memory cell used in EPROMs is the floating gate avalanche injection metal oxide semiconductor (FAMOS) transistor. The FAMOS transistor has a control gate terminal, a floating gate, a source terminal and a drain terminal such that a channel connects the source terminal and the drain terminal. The floating gate is disposed between the channel and a control gate which is coupled to the control gate terminal. The floating gate is electrically isolated from the channel and from the control gate. Isolation is achieved by using a thin insulative layer. Programming is accomplished by creating an avalanche breakdown condition at the drain-to-channel junction. When this happens, avalanche breakdown occurs and electrons are injected through the insulation onto the floating gate. A presently preferred embodiment of an EPROM memory cell utilizes an n-channel FAMOS transistor. The use of FAMOS transistors in memory circuitry is well-known in the art. It will be appreciated that other memory devices, such as Flash EEPROMs (which can be electrically erased) may also be used with the present invention.

Figure 1:
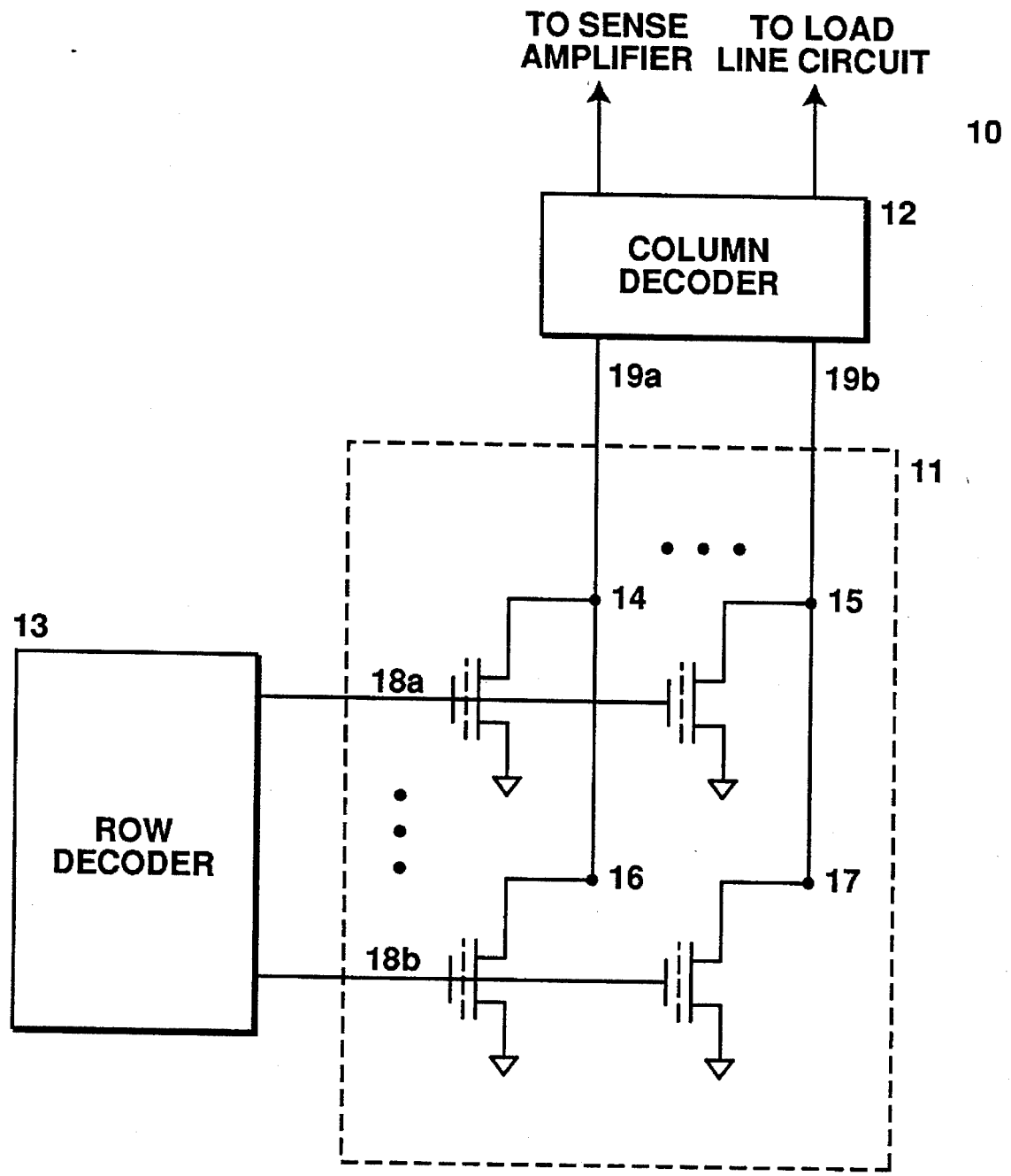
FIG. 1 is a block diagram of a typical EPROM device.

The EPROM or nonvolatile memory of the present invention includes a memory array logically organized into columns and rows. According to FIG. 1, FAMOS devices 14, 15, 16 and 17 form memory array 11 with FAMOS devices 14 and 15 forming a first row and FAMOS devices 16 and 17 forming a second row and furthermore, FAMOS devices 14 and 16 forming a first column and FAMOS devices 15 and 17 forming a second column. The memory array includes word lines 18a and 18b, coupling all FAMOS devices in each row at the gate of each FAMOS device and bit lines 19a and 19b, coupling all FAMOS devices in each column at the drain of each FAMOS device. Note that the source of FAMOS devices 14, 15, 16 and 17 are coupled to ground.

Furthermore, EPROM 10 includes a Column Decoder 12 and a Row Decoder 13, each comprising of select transistors. The select transistors in Column Decoder 12 couple the memory cells to be programmed to a programming voltage source. A more detailed discussion of the column decoders in the prior art and the present invention will be described later in conjunction with FIGS. 3 and 6.

Figure 2:
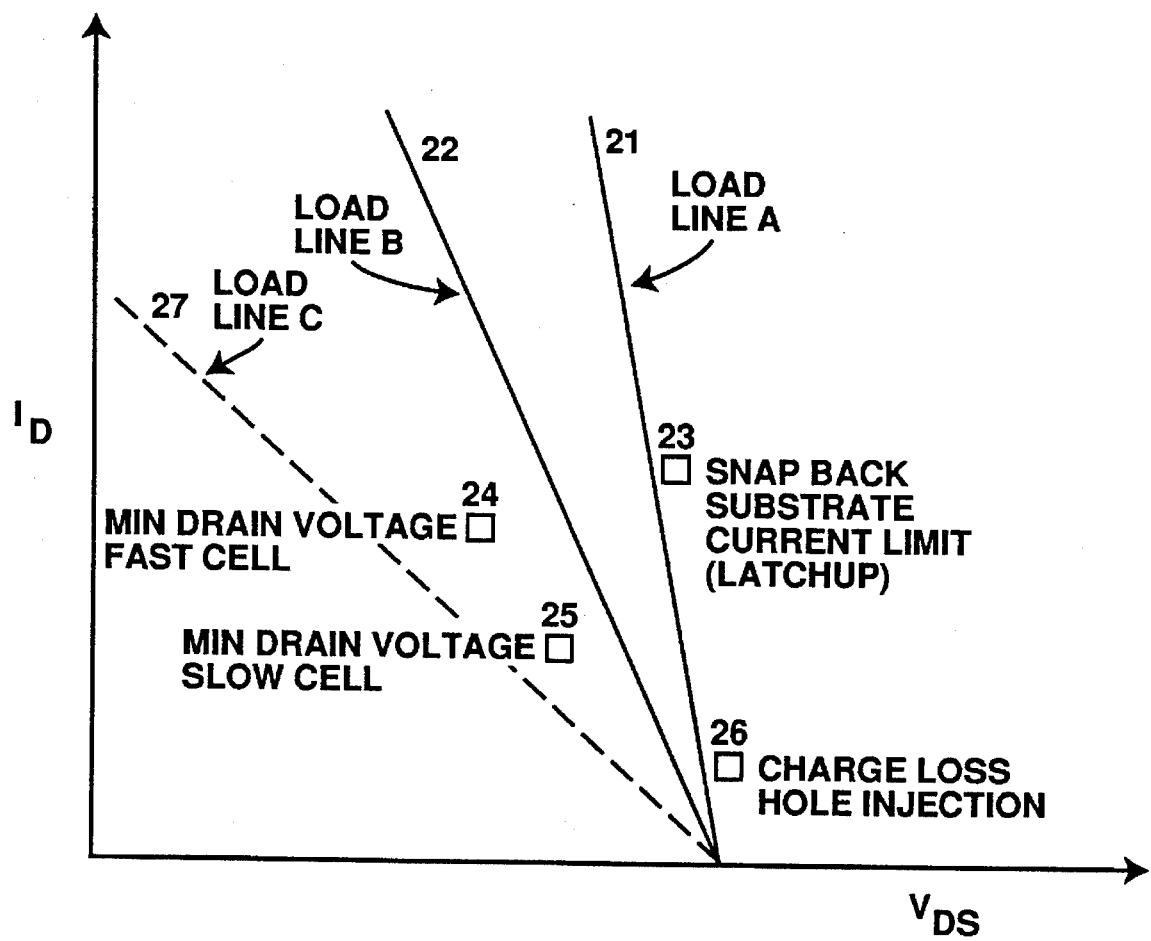
FIG. 2 depicts typical operating constraints also referred to as the load line "box" and a current-voltage characteristic load line for a nonvolatile memory cell.

FIG. 2 illustrates some of the operational constraints imposed on memory programming circuitry. The y-axis represents the bit line current passing through the memory cell (e.g. FAMOS transistors 14, 15, 16 and 17), thus also representing the drain-to-source current $I_D$ of each FAMOS transistor being programmed. The x-axis represents the voltage measured across the memory cell or the drain-to-source voltage on a FAMOS transistor.

FIG. 2 also illustrates the current-voltage characteristic (also referred to as the load line) applied to a memory cell on a bit line during a programming operation. The slope of Load Line A 21 and Load Line B 22 determines the range of current and voltages available to the memory cell being programmed. Although the slope of the line is variable, the operating ranges must remain at least within the boundaries defined by the constraints 23, 24, 25 and 26.

If a memory cell voltage falls below a functionality constraint 24, the electric fields in the memory cell may drop thus inhibiting programming. Thus, functionality constraint 24 which is the minimum drain voltage permitted for a fast cell, provides one corner of the box within which the memory cell must operate.

One performance objective of a memory array is to permit fast programming speed. Therefore, if the current-voltage characteristic curve drops below a programming speed constraint 25 which is the minimum drain voltage of a slow cell, the memory will not perform as desired. Note that the variability of the manufacturing process generates both slow cells and fast cells. Current-voltage characteristic line C 27 is shown as an example of a programming circuit which provides too little current for programming. Programming will take longer than is desirable or not at all when insufficient current is being passed through the memory cell's bit line. Thus, a second corner of the box within which programming of the memory cell must operate is defined.

If the current exceeds a substrate threshold constraint 23, the memory cell will be subjected to latchup and thus becoming non-functional. The substrate threshold constraint 23 provides yet another box corner.

Finally, if the voltage exceeds a charge loss hole injection threshold 26, then effects such as "drain disturb" will inhibit proper operation of the memory cell ("drain disturb" is the leakage of charge from the floating gates of memory cells that share the same bit line as the cell being programmed). Thus, the "drain disturb" threshold 26 defines another corner of the box within which programming of the memory cell must operate.

For reliable programming, the load line must pass above and to the right of constraints 24 and 25, and below and to the left of constraints 23 and 26. This ensures that enough current is available without exceeding the maximum current or voltage. Note that the slope of Load Line A 21 and Load Line B 22 may be adjusted by increasing or decreasing the resistance from the Load Line Circuit. According to FIG. 2, Load Line B 22 has more resistance than Load Line A 21.

Figure 3:
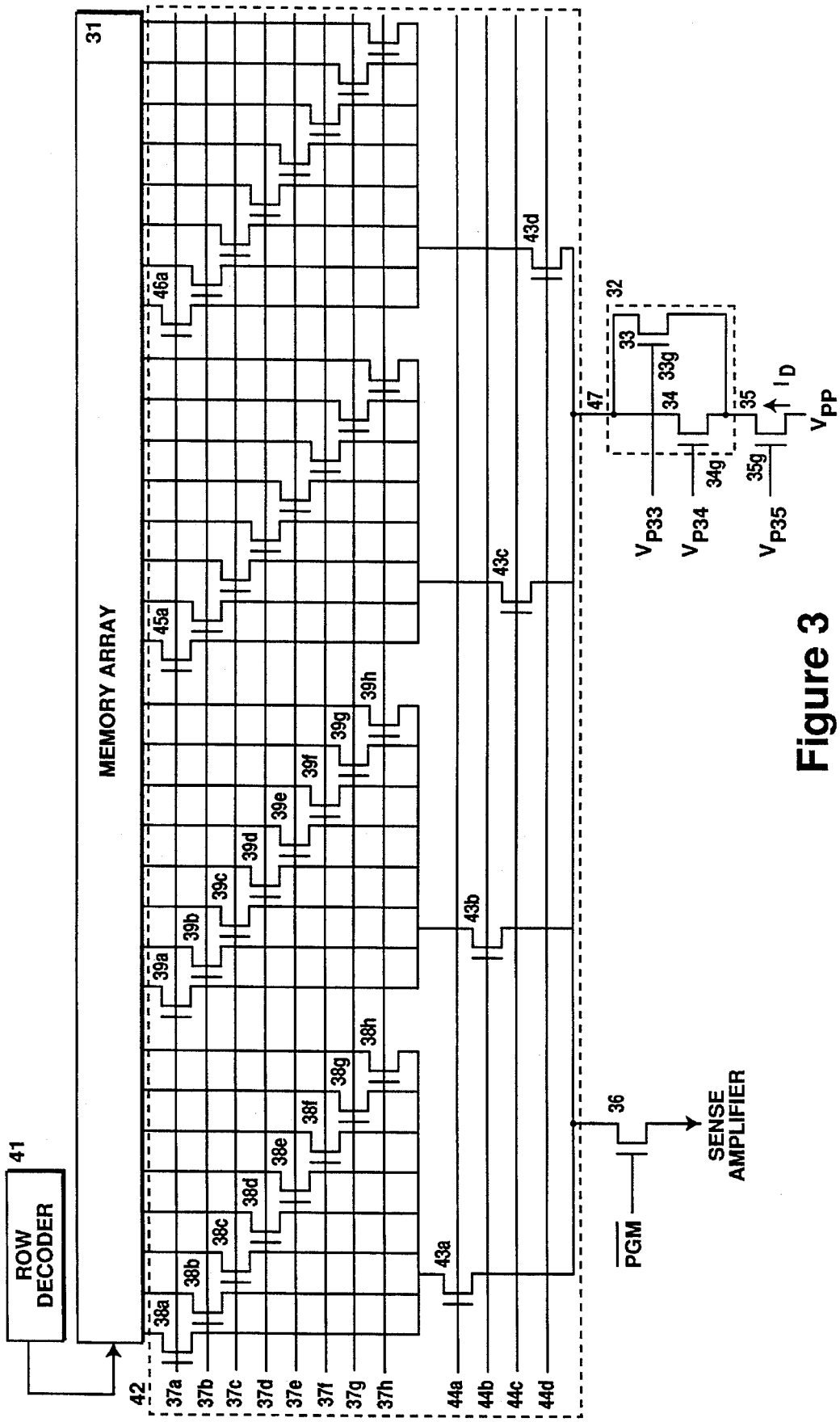
FIG. 3 illustrates the prior art decoding scheme of an EPROM.

A typical column decoding scheme is illustrated in FIG. 3. Memory Array 31 is coupled to a Row Decoder 41, and also coupled a Column Decoder 42 which is coupled to a Sense Amplifier through a high voltage block transistor 36. Column Decoder 42 is also coupled to the programming voltage Vpp via a Load Line Circuit 32 coupled in series with MOS transistor 35. MOS transistor 35 operates as a switch thereby allowing current to flow through MOS transistor 35 during a programming operation, and preventing current from flowing through MOS transistor 35 when a programming operation is not occurring. Column Decoder 42 comprises a first level and a second level decoding scheme such that the first level decodes the two higher order column address bits of each selected memory cell and the second level decodes the three lower order column address bits of each selected memory cell. The first level of Column Decoder 42 includes the four Select Lines 44a–44d and the second level of Column Decoder 42 includes the eight Select Lines 37a–37h.

Load Line Circuit 32 includes MOS transistor 34 and MOS transistor 33 coupled in parallel such that the drains of MOS transistors 33 and 34 are coupled to the source of MOS transistor 35 and the sources of MOS transistors 33 and 34 are coupled to the drains of MOS transistors 43a, 43b, 43c and 43d.

The operation of the circuit shown in FIG. 3 is as follows.

During a programming operation, a programming voltage Vpp (typically 12V) is applied to Load Line Circuit 32, which limits the programming current/voltage. Furthermore, a voltage Vp35 is applied to the gate 35g of MOS transistor 35, and a voltage Vp33 or Vp34 is applied to gate 33g or 34g of MOS transistor 33 or 34, respectively. The voltages Vp33 and Vp34 are selected such that during programming, Load Line Circuit 32 provides the main resistance, and the voltage Vp35 is selected such that during programming MOS transistor 35 provides negligible resistance compared to the resistance of Load Line Circuit 32 (e.g. Vp33=10V, Vp34=10V, and Vp35=15V). Then, Column Decoder 42 and Row Decoder 41 select which memory cell within memory array 31 that will see the programming current/voltage on its drain. Note that the gate voltages applied to the MOS transistors within Column Decoder 42 are also selected to make the resistance of Column Decoder 42 negligible compared to the resistance of Load Line Circuit 32.

The programming Load Line Circuit (otherwise known as the load line resistance), identified by box 32, ensures that the Load Line 47 is operating within the load line "box". In this particular embodiment, either a single memory cell per output or four memory cells per output are selected for a programming operation. Typically, during normal programming by the end-user of the EPROM, only 1 bit per output is selected by enabling two select lines, one from the group 37a–37h (e.g. second level) and the other from the group 44a–44d (e.g. first level). However, 4 bits per output can be selected during production testing by the manufacturer such that 32 bits are programmed at the same time (provided the EPROM has 8 outputs). When, 4 bits per output are selected rather than 1 bit per output, Column Decoder 42 selects four column addresses per output rather than one.

According to FIG. 3, if 1 bit per output is chosen for programming, then the first level of Column Decoder 42 which is represented by select lines 44a–44d, selects one of the following MOS transistors 43a, 43b, 43c or 43d based on the higher two address bits of the selected memory cell. Next, a select line from the second level of Column Decoder 42 is selected such that a select transistor in the column grouping corresponding to the selected select transistor in the first level of Column Decoder 42 is selected.

For example, if MOS transistor 43a in the first level of Column Decoder 42 is selected by select line 44a, then one of the following MOS transistors 38a–38h in the corresponding column grouping in the second level of Column Decoder 42 is selected by select lines 37a–37h. In another example, if MOS transistor 43b is selected, than one of the following MOS transistors 39a–39h is selected such that Column Decoder selects another single bit line in Memory Array 31. At this point, the programming current/voltage now flows through the second level of Column Decoder 42 to Memory Array 43 to program the selected memory cell.

On the other hand, if 4 bits per output are selected for programming, the select lines 44a–44d selects all four MOS transistors 43a, 43b, 43c and 43d. By increasing the voltage at the gate of the selected MOS transistors above Vpp, the programming current/voltage flows through all the selected MOS transistors in the first level of Column Decoder 42 to the second level of Column Decoder 42 represented by select lines 37a–37h. Once, the programming current passes through the first level of Column Decoder 42, then one of the following select lines 37a–37h, in the second level Column Decoder 42 selects a MOS transistor from each of the column groupings. According to FIG. 3, select transistors 38a–38h is an example of a column grouping and select transistors 39a–39h is another example of a column grouping. If select line 37a is selected, then select transistors 38a, 39a, 45a and 46a are selected. By increasing the voltage at the gate of the MOS transistors selected in the second level, the programming current/voltage now flows through the second level of Column Decoder 42 to Memory Array 31 to program the selected memory cell. In the embodiment shown in FIG. 3, 5 address bits are used such that 32 different bit lines can be selected. However, Column Decoder 42 is not limited to 5 address bits and may be used to decode any number of bit lines.

Still referring to FIG. 3, when programming 1 bit per output a voltage Vp34 is applied to the gate 34g of MOS transistor 34 thereby providing a load line resistance for 1 bit per output, and when programming 4 bits per output a voltage Vp33 is also applied to the gate 33g of MOS transistor 33 thereby providing a load line resistance for 4 bits per output. Since MOS transistor 33 has a channel width that is three times larger than the channel width of MOS transistor 34, MOS transistor 33 provides a lower resistance than MOS transistor 34 when selected due to the wider channel necessary to supply four times as much current. The channel dimensions are illustrated as shown in FIG. 2.8 of page 40 of "Principles of CMOS VLSI Design" by Neil H. E. Weste and Kamran Eshraghian (Addison-Wesley Publishing Co., 1985), where length (L) is the distance the majority charge carriers move in going from the source to the drain in the channel region. Thus, by selecting 4 bits per output to be programmed at the same time, the resistance of Load Line Circuit 32 decreases and may fall outside the load line "box" for the four selected cells within Memory Array 31.

Furthermore, when programming 4 bits per output, all four memory cells being programmed share the same load line resistance such that the programming voltage/current depends on all four memory cells, thus making the effective load line "box" much smaller and harder to predict. In comparison to programming only 1 bit per output, it is much more difficult for the load line (or resistance) put in the drain path of the selected memory cell(s) to control the programming voltage/current when programming multiple bits.

Figure 4:
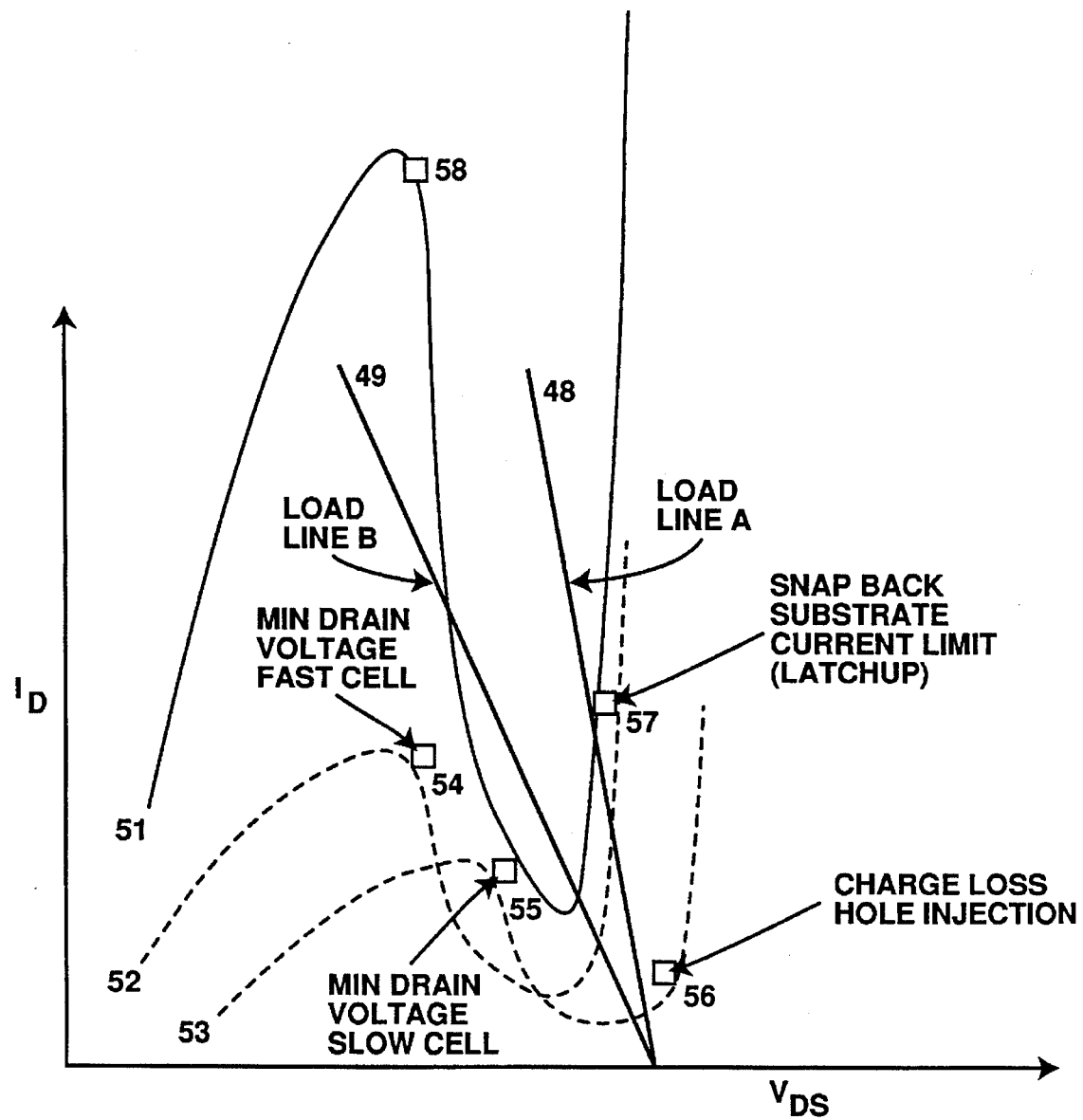
FIG. 4 illustrates a load line "box" in the prior art having multiple bits programmed simultaneously.

For example, when 1 bit per output is programmed, then the load line "box" corners are defined by constraints 54, 55, 56 and 57 generated by the curves 52 and 53, as illustrated in FIG. 4. Curve 53 represents the characteristics of a slow cell and curve 52 represents the characteristics of a fast cell in which the speed of the cell is dependent on the manufacturing process variability. However, curve 51 represents the combined characteristics of 4 fast cells being programmed such that constraint 58 becomes a corner of the load line "box".

As illustrated in FIG. 4, the load line "box" represented by constraints 58, 55, 56 and 57 is much smaller than the load line "box" represented by constraints 54, 55, 56 and 57. Therefore, when programming 4 memory cells that share the same load line, the load line "box" becomes smaller and much more difficult to predict thus becoming more difficult to navigate the load line resistance through the load line "box". The disadvantage of this architecture is that it is more likely that the fast bits will not program, or that substantial substrate current will cause latchup. Furthermore, there are other disadvantages that are performance related as a result of decreasing the load line. For example, by decreasing the load line resistance, the load seen be the sense amp increases and an extra device is required to block the high voltage from the sense amp (e.g. MOS transistor 36 shown in FIG. 3).

Figure 5:
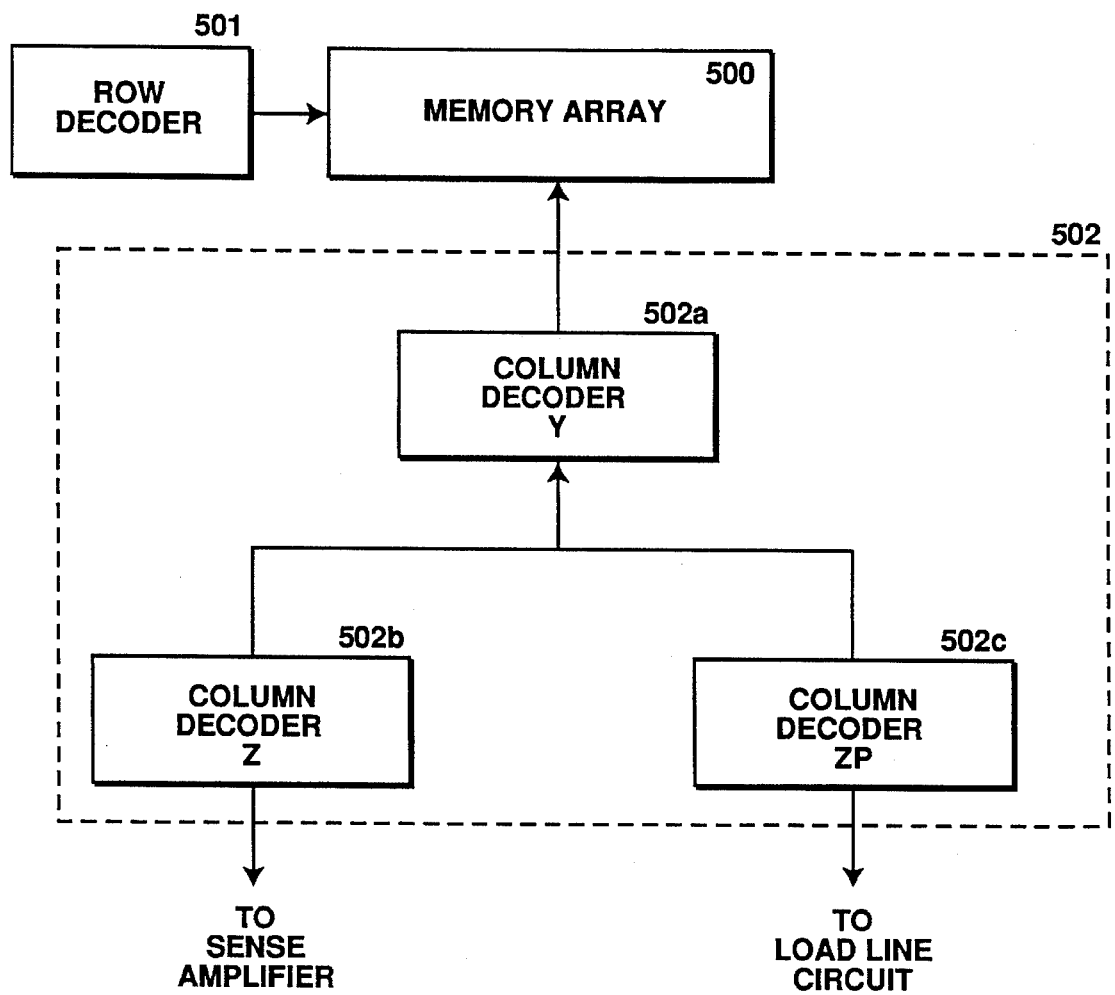
FIG. 5 illustrates a block diagram of the decoding scheme in the present invention.

In the preferred embodiment of the present invention, the EPROM uses an enhanced decoding scheme as shown in FIG. 5. According to FIG. 5, Memory Array 500 is coupled to Row Decoder 501 and Column Decoder 502 which is coupled to the Sense Amplifier and the Load Line Circuit. Column Decoder 502 includes Column Decoder Y 502a for decoding the lower order address bits of each memory cell, Column Decoder Z 502b for decoding the higher order address bits of each memory cell during a reading operation, and Column Decoder ZP 502c for decoding the higher order address bits of each memory cell during a programming operation. Unlike the prior art shown in FIG. 3, the decoding scheme in the present invention decodes the higher order address bits differently depending upon whether a programming operation or a reading operation is being performed. The advantages of the decoding scheme in the present invention will become more apparent as the present invention is described in further detail.

Figure 6:
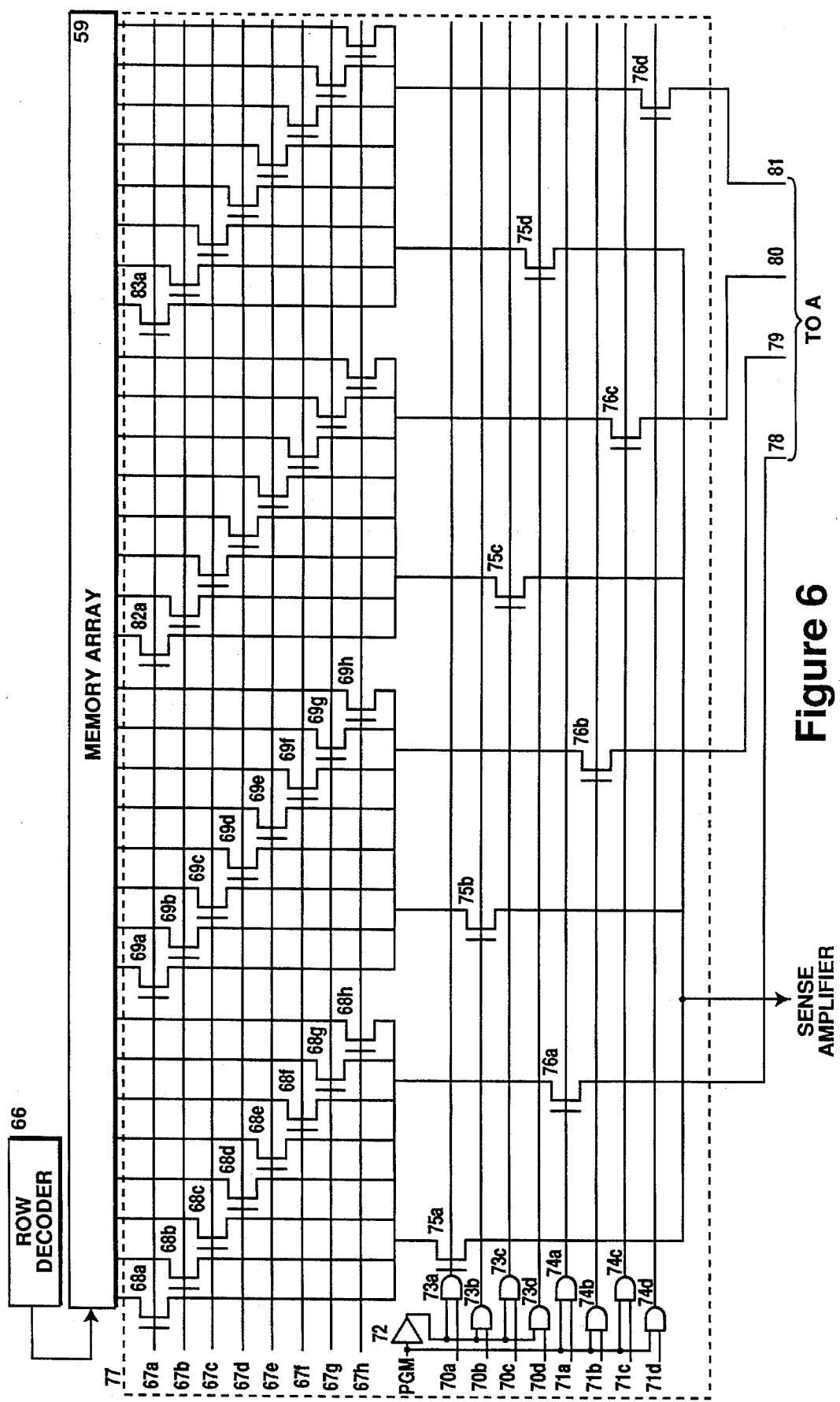
FIG. 6 illustrates a detailed drawing of a decoding scheme in an embodiment of the present invention.
Figure 6A:
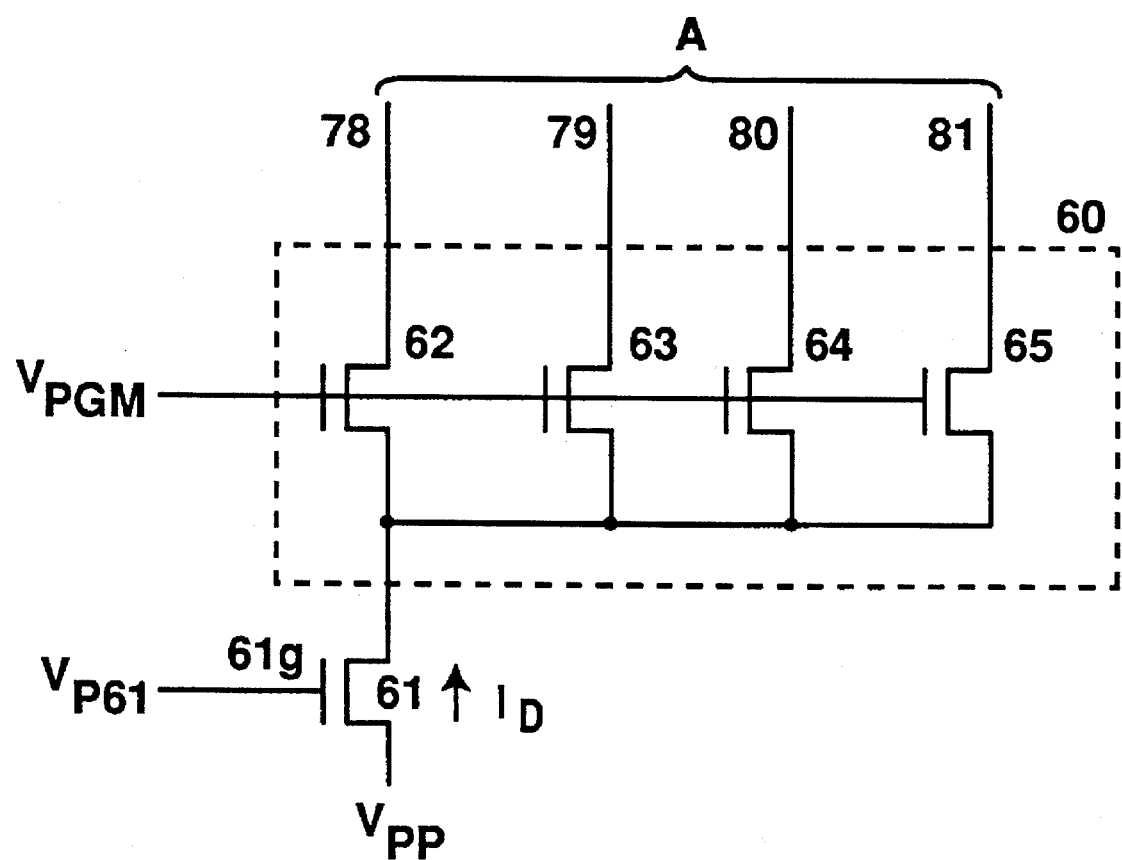

According to FIG. 6 illustrating a more detailed drawing of the present invention, Memory Array 59 is coupled to Row Decoder 66 and Column Decoder 77. Furthermore, Column Decoder 77 is coupled to the Sense Amplifier, and the programming voltage Vpp via Load Line Circuit 60 and MOS transistor 61 which are connected in series. MOS transistor 61 operates as a switch thereby allowing current to flow through MOS transistor 61 during a programming operation, and preventing current from flowing through MOS transistor 61 when a programming operation is not occurring. Load Line Circuit 60 comprising MOS transistors 62, 63, 64 and 65 coupled in parallel such that the drains of MOS transistor 62, 63, 64 and 65 are coupled together and are also coupled to the source of MOS transistor 61. Furthermore, the gates of MOS transistors 62, 63, 64 and 65 in Load Line Circuit 60 are all coupled to the programming voltage $V_{PGM}$. Note that other Load Line Circuits may be substituted for Load Line Circuit 60. For example, the Load Line Circuit in FIG. 6 may be implemented with the Load Line Circuit described in the U.S. patent application "Memory Programming Load-Line Circuit with Dual Slope I-V Curve" by Bruce Pricket, Jr., Ser. No. 08/115,217, filed Sep. 1, 1993. Furthermore, note that MOS transistor 61 may be eliminated in an alternative embodiment such that Vpp is connected directly to Load Line Circuit 60.

Column Decoder 77 comprises of a first level of Column Decoder 77 and a second level of Column Decoder 77. The second level of Column Decoder 77 comprises select lines 67a–67h which decode the lower three address bits of the memory cell selected for either a reading operation or a programming operation. The first level of Column Decoder 77 comprises a read column decoder and a programming column decoder. The read column decoder comprises select lines 70a–70d for decoding the two higher address bits of the selected memory cell during a reading operation. The programming column decoder comprises select lines 71a–71d for decoding the two higher address bits of the selected memory cell during a programming operation.

The first level column decoder also includes an enable circuit for enabling the read column decoder while disabling the programming column decoder, or enabling the programming column decoder while disabling the read column decoder. The enable circuit includes AND gates 73a–73d and 74a–74d and an inverter circuit 72 which receives a voltage PGM at the programming input.

The programming input PGM is asserted "high" during a programming operation and asserted "low" during a reading operation such that select lines 70a–70d are enabled by AND gates 73a–73d which are connected to the programming input PGM via an inverter 72 during a reading operation, and select lines 71a–71d are enabled by AND gates 74a–74d which is connected directly to the programming input PGM during a programming operation. Once a select line is enabled, a high voltage may be transmitted over the select line such that the voltage of the gate terminal of the MOS transistor coupled to the select line may be increased, and once the gate voltage of the MOS transistor is above its threshold voltage, the MOS transistor turns "on" and current is allowed to flow from the drain to the source of the MOS transistor coupled to the select line.

During a reading operation when the programming input PGM is asserted "low", select lines 70a–70d are enabled and select lines 71a–71d are disabled. Once select lines 70a–70d are enabled, the selection of MOS transistors 75a–75d become dependent on the higher two address bits of the memory cell selected for a reading operation. For example, select line 70a is selected when the higher two address bits are "00", select line 70b is selected when the higher two address bits are "01", select line 70c is selected when the higher two address bits are "10", and select line 70d is selected when the higher two address bits are "11". If select line 70a is selected and the programming input PGM is asserted "low" such that AND gate 73a enables select line 70a to increase the voltage at the gate of MOS transistor 75a above a threshold voltage of MOS transistor 75a, then MOS transistor 75a is turned "on" thereby allowing current to flow from the drain to the source of MOS transistor 75a. Furthermore, when the programming input PGM is asserted "low" and select line 70b is selected, then MOS transistor 75b is turned "on" and if select line 70c is selected then MOS transistor 75c is turned "on" and if select line 70d is selected then MOS transistor 75d is turned "on". An advantage of having select lines specifically dedicated to a reading operation is that MOS transistors 75a–75d are smaller than MOS transistors 43a–43d in FIG. 3, and they have less loading because they do not have to pass the programming voltage. Furthermore, the load seen by the sense amplifier is reduced because the diffusion load of load line transistor 33 of FIG. 3 is not directly connected to the read path. The advantage of reducing the load seen by the sense amplifier is to increase the performance of the integrated circuit during a reading operation.

On the other hand, during a programming operation when a voltage Vpp is applied to the EPROM at the drain of MOS transistor 61 and a programming voltage $V_{P61}$ is applied to the gate 61g of MOS transistor 61, the programming voltage/current is channeled through Load Line Circuit 60 comprising MOS transistors 62, 63, 64 and 65. Note that a voltage $V_{PGM}$, applied to the gates of MOS transistors 62, 63, 64 and 65 must be large enough to turn "on" MOS transistors 62, 63, 64 and 65 in order for the programming current $I_D$ to be channeled through all four MOS transistors in the Load Line Circuit 60. Note that the gate voltage for MOS transistors 62, 63, 64 and 65, and the width of these transistors is such that their resistance is the most significant contribution to the total loadline resistance which sets the programming current and voltage. Also, note that the width of MOS transistors 62, 63, 64 and 65 are approximately the same size as MOS transistor 34 in FIG. 3 and that the programming current $I_D$ is distributed equally to the four MOS transistors 62, 63, 64 and 65 and among Load Lines 78, 79, 80 and 81.

During the programming operation the programming input, PGM is asserted "high" such that select lines 71a–71d are enabled and select lines 70a–70d are disabled during the programming operation. If select lines 71a–71d are selected (i.e. asserted "high") and the programming input PGM is asserted "high", then the voltage at the gate of MOS transistors 76a–76d are increased such that MOS transistors 76a–76d are turned "on". Note that the gate voltage for MOS transistors 76a–76d is high enough that their resistance is not significant compared to MOS transistors 62–65 in FIG. 5. Once, MOS transistors 76a–76d are turned "on", then the programming current $I_D$, channeled through Load Line Device 60, can now pass through MOS transistors 76a–76d to be decoded at the second level column decoder by select lines 67a–6h.

Similar to the second level column decoding scheme in FIG. 3, the select transistors in the second level of Column Decoder 77 is organized into column groupings. Each column grouping comprises eight select transistors such that each of the following select line 67a–67h selects one select transistor in each of the column groupings when selected. According to FIG. 6, select transistors 68a–68h forms a column grouping and select transistors 69a–69h forms another column grouping. FIG. 6 illustrates a total of four column groupings such that when select line 67a is selected, select transistors 68a, 69a, 82a and 83a are turned "on" by increasing the voltage at the gates of each of these transistors above their threshold voltages, thus allowing the programming voltage Vpp to be applied to memory cells selected for programming. Note that the gate voltage for MOS transistors 68a, 69a, 82a, and 83a, is high enough that their resistance is not significant compared to MOS transistors 62–65. Depending on the three higher address bits, one of the following MOS select lines 67a–67h is selected. Simultaneously, Row Decoder 66 selects the word line in Memory Array 59. The memory cells selected by Row Decoder 66 and Column Decoder 77 can be programmed by hot electron injection programming as described above in the background section.

The present invention provides a column decoding scheme that separates the "load line" resistance for each cell during multiple bit programming, and separates the read and programming select lines for the higher order column decode. The advantage of this particular decoding scheme is that the load line "box" becomes predictable thereby making the multiple bit hot electron programming reliable. The load line "box" for programming multiple bits becomes predictable in the sense that it becomes similar to programming a single bit, whose voltage-current characteristic curves are much better understood.

Figure 7:
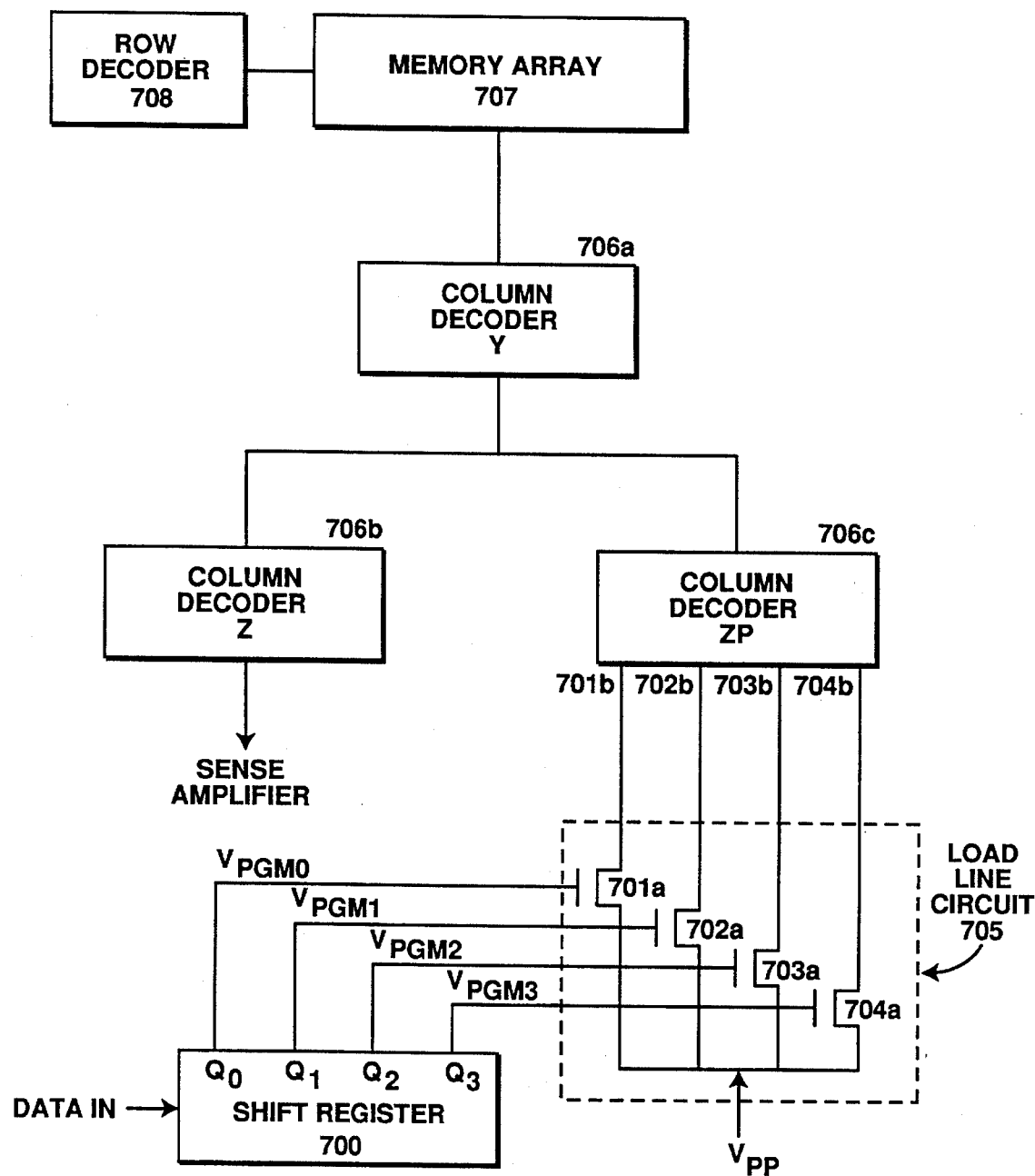
FIG. 7 illustrates an embodiment of the present invention that allows the user to program multiple bits with unique data.

Another advantage of the present invention is the ability to program different data into the memory cells during multiple bit programming. Rather than inputting all "zeros" or all "ones" into the four bits selected for programming, patterns such as "0001", "0110", "1010", etc. may be programmed into the memory cells. FIG. 7 illustrates a unique control circuit implemented with a Shift Register 700 that is coupled to a Load Line Circuit 705. According to FIG. 7, Memory Array 707 is coupled to Row Decoder 708, and Column Decoder Y 706a which is also coupled to Column Decoder Z 706b and Column Decoder ZP 706c. Furthermore, Column Decoder ZP 706c is coupled to MOS transistors 701a–704a in Load Line Circuit 705 via Load Lines 701b–704b. The desired pattern of data to be programmed by the end-user is inputted into Shift Register 700. Each output of Shift Register 700 $Q_3$-$Q_0$, is coupled to a gate of one of the MOS transistors in the Load Line Circuit 705 which includes MOS transistors 701a–704a, thereby controlling (e.g. turning "off" and "on") MOS transistors 701a–704a by providing voltages $V_{PGM0}$–$V_{PGM3}$ to the gates of MOS transistors 701a–704a, respectively.

For example, if the pattern "0111" is shifted into shift register 700, then outputs $Q_1$–$Q_3$ are asserted "high" and the output $Q_3$ is asserted "low" such that MOS transistors 702a–704a are turned "on" and MOS transistor 701a is turned "off". Since MOS transistors 702a–704a are turned "on", the current generated from the programming voltage Vpp, is distributed among load lines 702b–704b and thus programming the memory cells selected by Column Decoder ZP 706c which are coupled to load lines 702b–704b. Since MOS transistor 701a is turned "off", current generated from the programming voltage Vpp does not provide a current to load line 701b, thus the memory cell selected by Column Decoder ZP and coupled to load line 701b is left in the unprogrammed state. Thus a pattern of "0111" is stored in the memory cells selected for programming.

I claim:

1. A memory circuit having multiple bit programming comprising:
    (a) a memory array that includes a plurality of memory cells, a plurality of bit lines and a plurality of word lines wherein each memory cell is coupled to a bit line and a word line;
    (b) a row decoder coupled to said memory array, said row decoder selects at least one of said plurality of word lines during a programming operation or a reading operation of said nonvolatile memory circuit;
    (c) a column decoder coupled to said memory array that includes a programming column decoder and a read column decoder wherein said programming column decoder selects at least one of said bit lines during said programming operation of said nonvolatile memory circuit and said read column decoder selects at least one of said bit lines during said reading operation of said nonvolatile memory circuit;
    (d) a load line circuit coupled to said column decoder, said load line circuit provides a resistance in a programming path from a programming input of said memory circuit to each of said memory cells during said programming operation;
    (e) a sense amplifier coupled to said column decoder, said sense amplifier detects a change in voltage in one of said bit lines during said reading operation.

2. The memory circuit of claim 1, wherein said column decoder includes a first level column decoder and a second level column decoder, said second level column decoder decodes a plurality of lower order address bits of a selected bit line during said reading operation and said programming operation of said memory circuit, said first level column decoder includes said programming column decoder and said read column decoder wherein said programming column decoder decodes a plurality of higher order address bits of said selected bit line during said programming operation and said read column decoder decodes said plurality of higher order address bits of said selected bit line during said reading operation.

3. The memory circuit of claim 2, wherein said load line circuit comprises a plurality of load lines, each of said load lines is coupled to said programming decoder in said first level column decoder and wherein said memory circuit is nonvolatile memory.

4. The memory circuit of claim 3, wherein said programming column decoder in said first level column decoder comprises a first enable circuit, a first plurality of select lines and a first plurality of select transistors, each of said first plurality of select transistors having a first terminal, a second terminal and a third terminal, said first terminal is coupled to said first enable circuit by a corresponding select line in said first plurality of select lines, said second terminal is coupled to said second level column decoder, said third terminal is coupled to said load line circuit by a corresponding load line in said plurality of load lines.

5. The memory circuit of claim 3, wherein said read column decoder in said first level column decoder comprises a second enable circuit, a second plurality of select lines and a second plurality of select transistors, each of said second plurality of select transistors having a first terminal, a second terminal and a third terminal, said first terminal is coupled to said second enable circuit by a corresponding select line in said second plurality of select lines, said second terminal is coupled to said second level column decoder, said third terminal is coupled to said sense amplifier.

6. The memory circuit of claim 3, wherein said second level column decoder comprises a third plurality of select lines and a third plurality of select transistors wherein said third plurality of select transistors is subdivided into a plurality of column groupings wherein each column grouping has a fourth plurality of select transistors, each of said fourth plurality of select transistors having a first terminal, a second terminal and a third terminal, said first terminal is coupled to a corresponding select line in said third plurality of select lines, said second terminal is coupled to a corresponding bit line in said memory array, said third terminal of each of said fourth plurality of select transistors in each of said column grouping is coupled to a corresponding select transistor in said programming column decoder and a corresponding select transistor in said read column decoder.

7. The memory circuit of claim 3, wherein said load line circuit further comprises a plurality of MOS transistors, each of said plurality of MOS transistors having a first terminal, a second terminal and a third terminal, said first terminal is coupled to a first input of said memory circuit, said second terminal is coupled to said programming column decoder by a corresponding load line in said plurality of load lines, said third terminal is coupled to said programming input of said memory circuit.

8. A memory circuit of claim 4, wherein said first enable circuit comprises a plurality of AND gates, each of said plurality of AND gates having a first input, a second input and an output, said first input of each of said AND gates is coupled to a second input of said memory circuit, said second input of each of said AND gates is coupled to a corresponding select line in said first plurality of select lines, said output of each of said AND gates is coupled to said third terminal of a corresponding select transistor in said first plurality of select transistors such that when said second input of said memory circuit provides a signal having a first value, said first plurality of select lines is enabled and when said second input of said memory circuit provides said signal of a second value, said second plurality of select lines is disabled.

9. A memory circuit of claim 5, wherein said second enable circuit comprises a plurality of AND gates, each AND of said plurality of AND gates having a first input, a second input and an output, said second enable circuit further having an inverter circuit wherein said inverter circuit having an input and an output, said input of said inverter circuit is coupled to a second input of said memory circuit and said output of said inverter circuit is coupled to said first input of each of said AND gates, said second input of each of said AND gates is coupled to a corresponding select line in said second plurality of select lines, said output of each of said AND gates is coupled to said third terminal of a corresponding select transistor in each of said second plurality of select transistors such that when said second input of said memory circuit provides a signal of a first value, said second plurality of select lines is disabled, and when said second input of said memory circuit provides said signal of a second value, said first plurality of select lines is enabled.

10. The memory circuit of claim 1, wherein each memory cell in said memory array has a first terminal coupled to one of said bit lines and a second terminal coupled to one of said word lines and a third terminal coupled to ground.

11. The memory circuit of claim 1, wherein each of said memory cells comprises a FAMOS device having a drain coupled to one of said bit lines and a gate coupled to one of said word lines and a gate coupled to ground.

12. The memory circuit of claim 3, further comprising a control circuit coupled to said load line circuit, said control circuit providing a plurality of input signals to said load line circuit such that a unique pattern of data may be programmed into said memory array during said programming operation.

13. The memory circuit of claim 12, wherein said load line circuit further comprises a plurality of MOS transistors wherein each of said plurality of MOS transistors having a first terminal, a second terminal and a third terminal, said first terminal is coupled to a corresponding output of said control circuit, said second terminal is coupled to said programming column decoder by a corresponding load line in said plurality of load lines, said third terminal is coupled to said programming input of said memory circuit.

14. The memory circuit of claim 13, wherein said control circuit comprises a shift register having an input and a plurality of outputs such that data is shifted serially into said input of said shift register and data is shifted in parallel out of each of said plurality of outputs of said shift register.

15. A method of programming multiple memory cells of a nonvolatile memory circuit during a programming operation, said method comprising the steps of:

(a) applying a voltage to a programming input of said nonvolatile memory circuit;

(b) enabling a programming decoder in a first level column decoder such that a plurality of higher order address bits of said multiple memory cells selected for programming is decoded;

(c) disabling a reading decoder in said first level column decoder;

(d) decoding a plurality of lower order address bits of said multiple memory cells selected for programming by a second level column decoder;

(e) programming said multiple memory cells selected for programming.

* * * * *